(12) United States Patent
Chiu et al.

(10) Patent No.: US 10,230,152 B2
(45) Date of Patent: Mar. 12, 2019

(54) ELECTRONIC PACKAGE AND FABRICATION METHOD THEREOF

(71) Applicant: Siliconware Precision Industries Co., Ltd., Taichung (TW)

(72) Inventors: Chih-Hsien Chiu, Taichung (TW); Heng-Cheng Chu, Taichung (TW); Chien-Cheng Lin, Taichung (TW); Tsung-Hsien Tsai, Taichung (TW); Chao-Ya Yang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 566 days.

(21) Appl. No.: 14/098,490

(22) Filed: Dec. 5, 2013

(65) Prior Publication Data

US 2014/0210687 A1 Jul. 31, 2014

(30) Foreign Application Priority Data

Jan. 25, 2013 (TW) .............................. 102102800 A

(51) Int. Cl.
| | | |
|---|---|---|
| *H01Q 1/24* | (2006.01) | |
| *H01Q 1/22* | (2006.01) | |
| *H01Q 1/52* | (2006.01) | |
| *H01L 23/552* | (2006.01) | |

(52) U.S. Cl.
CPC ............. *H01Q 1/2283* (2013.01); *H01Q 1/24* (2013.01); *H01Q 1/52* (2013.01); *H01L 23/552* (2013.01); *H01Q 1/526* (2013.01); *Y10T 29/49016* (2015.01)

(58) Field of Classification Search
CPC .......... H01Q 1/24; H01Q 1/2283; H01Q 1/52; H01Q 1/526; H01Q 1/38; H01L 23/552
USPC ........... 343/872, 700 MS, 702, 851; 257/660
See application file for complete search history.

(56) References Cited

U.S. PATENT DOCUMENTS

| | | | | |
|---|---|---|---|---|
| 6,160,526 A | * | 12/2000 | Hirai ................ | G06K 19/07728 235/491 |
| 6,239,753 B1 | * | 5/2001 | Kado .................... | G08C 17/04 343/702 |
| 6,762,723 B2 | * | 7/2004 | Nallo .................... | H01Q 1/243 343/700 MS |
| 6,958,732 B2 | * | 10/2005 | Yuanzhu ............... | H01Q 1/243 343/702 |
| 8,063,846 B2 | * | 11/2011 | Imaoka ............... | H01Q 1/2283 343/851 |
| 2008/0231518 A1 | * | 9/2008 | Tsutsumi ............... | H01L 23/66 343/700 MS |

* cited by examiner

*Primary Examiner* — Hai Tran
(74) *Attorney, Agent, or Firm* — Mintz Levin Cohn Ferris Glovsky and Popeo, P.C.; Peter F. Corless; Steven M. Jensen

(57) ABSTRACT

An electronic package is provided, which includes: a substrate; at least an electronic element disposed on the substrate; an antenna structure disposed on the substrate; and an encapsulant formed on the substrate for encapsulating the electronic element and the antenna structure. Therein, the antenna structure has an extension portion and a plurality of support portions connected to the extension portion for supporting the extension portion over the substrate so as to save the surface area of the substrate, thereby meeting the miniaturization requirement of the electronic package.

8 Claims, 3 Drawing Sheets

ELECTRONIC PACKAGE AND FABRICATION METHOD THEREOF

BACKGROUND OF THE INVENTION

1. Field of the Invention

The present invention relates to electronic packages, and more particularly, to an electronic package having an antenna structure.

2. Description of Related Art

Along with the rapid development of electronic industries, electronic products are developed towards multi-function and high electrical performance. Wireless communication technologies have been widely applied in various kinds of consumer electronic products for receiving or transmitting various wireless signals. To meet the miniaturization requirement of consumer electronic products, wireless communication modules are becoming lighter, thinner, shorter and smaller. For example, patch antennas have been widely applied in wireless communication modules of electronic products such as cell phones and personal digital assistants (PDAs) due to their advantages of small size, light weight and easy fabrication.

FIG. 1 is a schematic perspective view of a wireless communication module. Referring to FIG. 1, the wireless communication module 1 has: a substrate 10, a plurality of electronic elements 11 disposed on and electrically connected to the substrate 10, an antenna structure 12 disposed on the substrate 10, and an encapsulant 13. The substrate 10 is a circuit board and has a rectangular shape. The antenna structure 12 is of a planar type. The antenna structure 12 has a main body 120 and a conductive wire 121, and the main body 120 is electrically connected to the electronic elements 11 through the conductive wire 121. The encapsulant 13 encapsulates the electronic elements 11 and a portion of the conductive wire 121.

However, based on the characteristic of electromagnetic radiation between the planar-type antenna structure 12 and the electronic elements 11 and limitation of the size of the planar-type antenna structure 12, the encapsulant 13 only covers the electronic elements 11 and exposes the main body 120 of the antenna structure 12. Therefore, a mold that corresponds in size to the disposing area of the electronic elements 11 instead of the overall substrate 10 is needed in a molding process for forming the encapsulant 13.

Further, the planar-type antenna structure 12 occupies a large surface area of the substrate 10 and hinders miniaturization of the wireless communication module 1.

Therefore, there is a need to provide an electronic package and a fabrication method thereof so as to overcome the above-described drawbacks.

SUMMARY OF THE INVENTION

In view of the above-described drawbacks, the present invention provides an electronic package, which comprises: a substrate; at least an electronic element disposed on the substrate; an antenna structure disposed on the substrate and having an extension portion and a plurality of support portions connected to the extension portion for supporting the extension portion over the substrate; and an encapsulant formed on the substrate for encapsulating the electronic element and the extension portion and the support portions of the antenna structure.

The present invention further provides a fabrication method of an electronic package, which comprises the steps of: providing a substrate having at least an electronic element disposed thereon; disposing an antenna structure on the substrate, wherein the antenna structure has an extension portion and a plurality of support portions connected to the extension portion for supporting the extension portion over the substrate; and forming an encapsulant on the substrate for encapsulating the electronic element and the extension portion and the support portions of the antenna structure.

In an embodiment, the substrate has a circuit electrically connected to the electronic element.

In an embodiment, the electronic element is an active element or a passive element.

In an embodiment, the antenna structure is made of a metal frame.

In an embodiment, the extension portion serves as a main body of the antenna structure.

In an embodiment, the extension portion has a bent shape, a circular shape or a C shape.

In an embodiment, the extension portion is located at a position higher than that of the electronic element.

In an embodiment, the support portions serve as input and ground terminals for electrically connecting the extension portion to the substrate.

In an embodiment, the extension portion surrounds the electronic element.

According to the present invention, the extension portion of the antenna structure is supported over the substrate by the support portions of the antenna structure, and the extension portion and the support portions of the antenna structure and the electronic element are encapsulated by the encapsulant. Therefore, the invention allows a mold having a size corresponding to the substrate to be used in a molding process for forming the encapsulant, thereby facilitating the molding process.

Further, since the extension portion can be supported by the support portions over a region of the substrate where the electronic element is disposed (i.e., where the encapsulant is to be formed), the invention avoids direct disposing of the extension portion on the substrate so as to save the surface area of the substrate. Therefore, compared with the prior art, the invention can effectively reduce the size of the substrate so as to meet the miniaturization requirement of the electronic package.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "on", "first", "second", "a" etc. are merely for illustrative purposes and should not be construed to limit the scope of the present invention.

Figure 1:
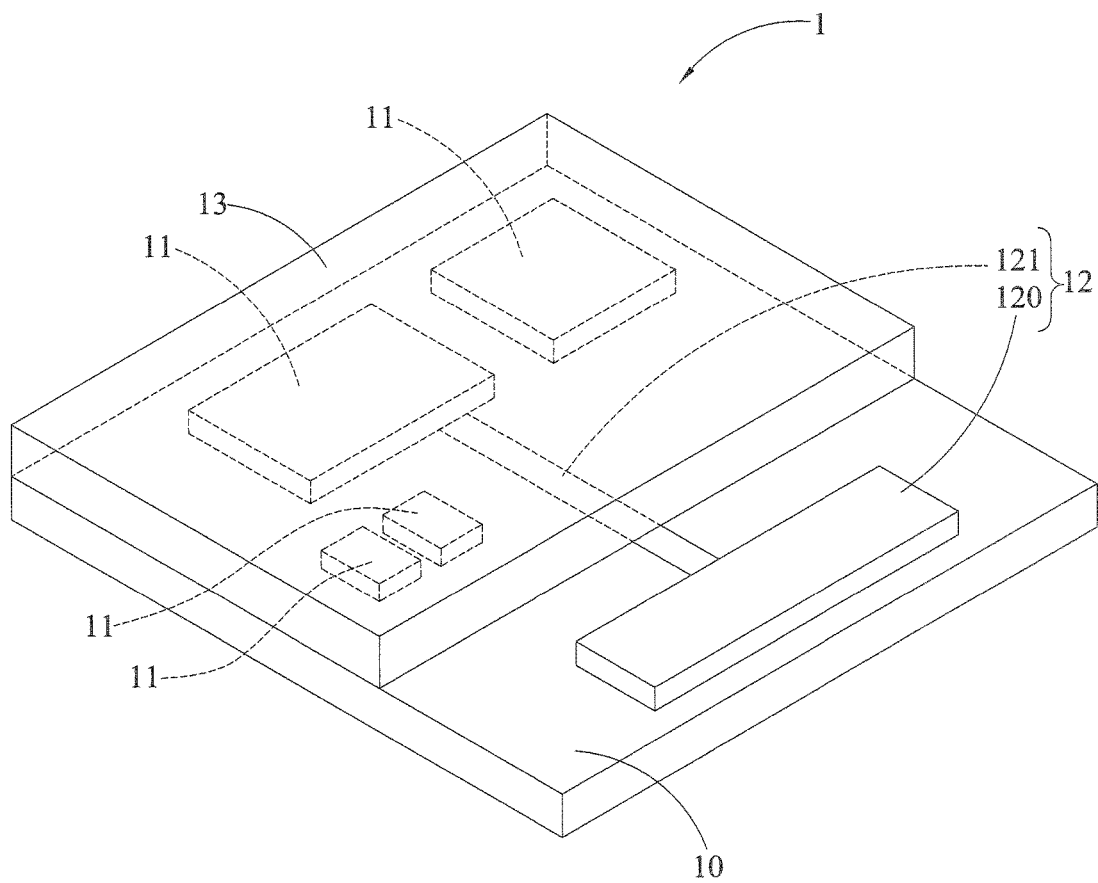
FIG. 1 is a schematic perspective view of a conventional wireless communication module.
Figure 2A:
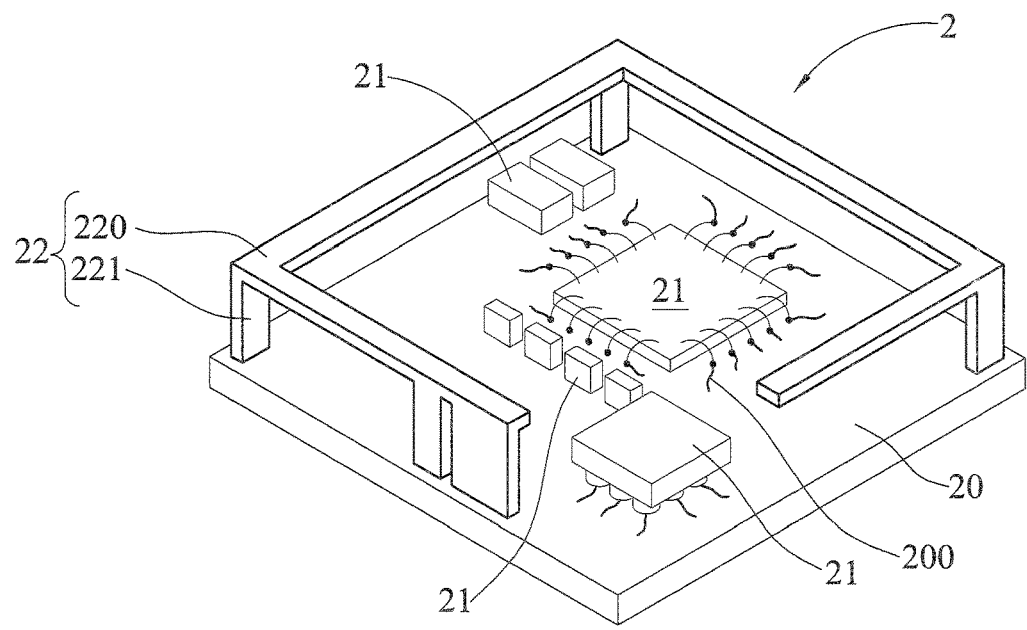
FIGS. 2A to 2B are schematic perspective views showing a fabrication method of an electronic package according to the present invention, wherein FIG. 2A' shows another embodiment of FIG. 2A.
Figure 2A:
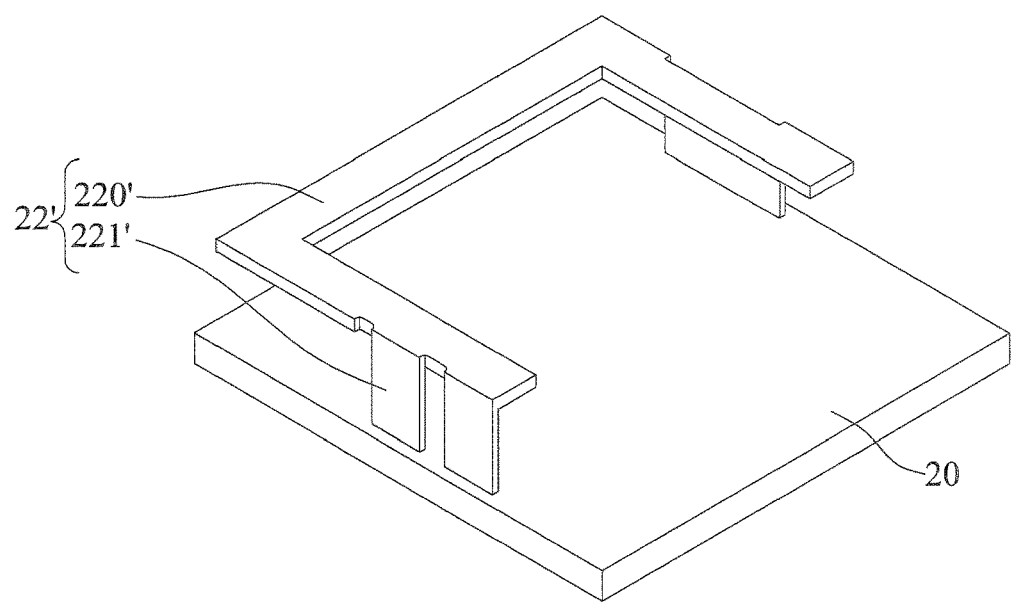
Figure 2B:
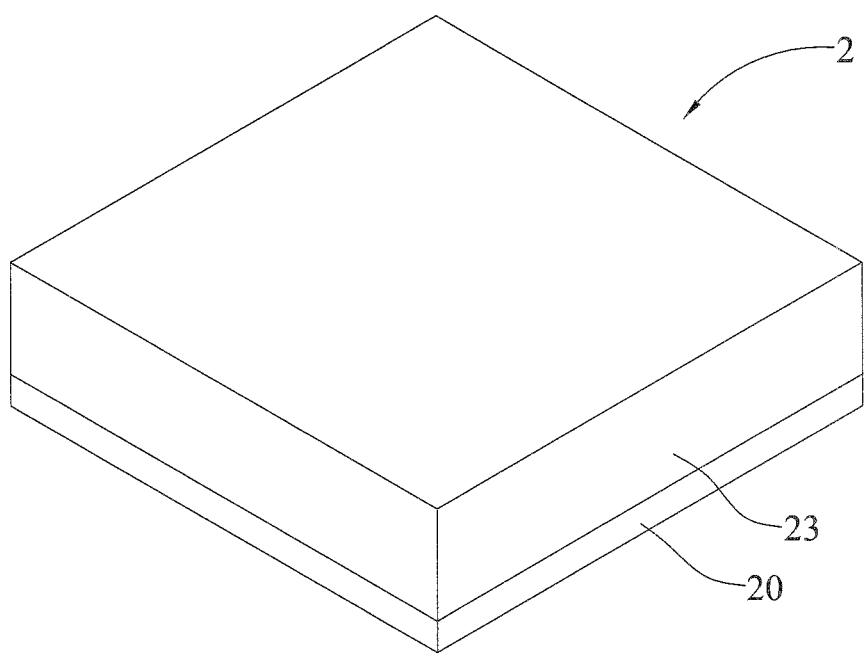

FIGS. 2A and 2B are schematic perspective views showing a fabrication method of an electronic package 2 according to the present invention. In the present embodiment, the electronic package 2 is a SiP (system in package) wireless communication module.

Referring to FIG. 2A, a substrate 20 is provided, which has a plurality of electronic elements 21 disposed thereon. Then, an antenna structure 22 is disposed on and electrically connected to the substrate 20.

In the present embodiment, the substrate 20 is a circuit board or a ceramic board and has a rectangular shape, and a circuit 200 is formed on the substrate 20. Further, a circuit layer (not shown) can be formed inside the substrate 20.

The electronic elements 21 can be active or passive elements. The electronic elements 21 are electrically connected to the circuit 200.

The antenna structure 22 is made of a metal frame. The antenna structure 22 has an extension portion 220 and a plurality of support portions 221 vertically disposed on the substrate 20 for supporting the extension portion 220 over the substrate 20. As such, the extension portion 220 is located at a position higher than that of the electronic elements 21. Further, the extension portion 220 extends along side edges of the substrate 20 so as to surround the electronic elements 21.

Furthermore, at least two support portions 221 are provided to serve as an input terminal and a ground terminal of the circuit 200, and the extension portion 220 serves as a main body of the antenna structure 22. The extension portion 220 can have an open shape, such as a C shape of FIG. 2A. Alternatively, referring to FIG. 2A', the extension portion 220' of the antenna structure 22' has an n shape. In other embodiments, the extension portion 220 can have a bent shape such as an L shape or a closed shape such as a circular shape.

Referring to FIG. 2B, an encapsulant 23 is formed on the substrate 20 to encapsulate the electronic elements 21 and the extension portion 220 and the support portions 221 of the antenna structure 22.

In the present invention, a metal sheet is formed into the 3D antenna structure 22 and then the extension portion 220 of the antenna structure 22 is disposed over the substrate 20 and surrounds the electronic elements 21 so as to allow the extension portion 220 and the electronic elements 21 to be encapsulated by the encapsulant 23 through a molding process. Therefore, the invention allows a mold having a size corresponding to the substrate 20 to be used in the molding process so as to facilitate the fabrication process.

Further, the encapsulant 23 can stably fix the antenna structure 22 to a certain height, and the dielectric constant of the encapsulant 23 can reduce the required electrical length of the antenna structure.

In addition, since the extension portion 220 is supported by the support portions 221 over the substrate 20, the antenna structure 23 can be disposed in the same region where the electronic elements 21 are disposed (i.e., where the encapsulant 23 is to be formed). As such, the invention avoids direct disposing of the extension portion 220 on the substrate 20 so as to save the surface area of the substrate 20. Compared with the prior art, the present invention can reduce the size of the substrate 20 so as to meet the miniaturization requirement of the electronic package 2.

Also, by disposing the extension portion 220 over the substrate 20, a receiving space is formed between the extension portion 220 and the substrate 20 so as for other electrical structures to be disposed therein.

The invention further provides an electronic package 2, which has: a substrate 20, a plurality of electronic elements 21 disposed on the substrate 20, and an antenna structure 22, 22'.

The substrate 20 has a circuit 200.

The electronic elements 21 are active or passive elements and electrically connected to the circuit 200.

The antenna structure 22, 22' is made of a metal frame. The antenna structure 22, 22' has an extension portion 220, 220' and a plurality of support portions 221, 221' vertically disposed on the substrate 20 for supporting the extension portion 220, 220' over the substrate 20. The extension portion 220, 220' extends along side edges of the substrate 20 to surround the electronic elements 21.

In the present embodiment, the extension portion 220, 220' is located at a position higher than that of the electronic elements 21.

In an embodiment, the extension portion 220, 220' has a C shape, a bent shape or a circular shape.

The support portions 221, 221' serve as input and ground terminals for electrically connecting the extension portion 220, 220' to the circuit 200 or an inner circuit layer of the substrate 20.

The electronic package 2 further has an encapsulant 23 formed on the substrate 20 for encapsulating the electronic elements 21 and the extension portion 220, 220' and the support portions 221, 221' of the antenna structure 22, 22'.

Therefore, the present invention provides a 3D antenna structure to replace the conventional planar type antenna structure. The 3D antenna structure can be disposed on the substrate in a region where the electronic elements are disposed to thereby facilitate the fabrication process and reduce the size of the substrate so as to meet the miniaturization requirement of the electronic package.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An electronic package, comprising:
a substrate having a surface;
at least an electronic element disposed on the surface of the substrate;
an antenna structure made of a metal frame and disposed on the surface of the substrate and having an extension portion and a plurality of support portions connected to the extension portion for supporting the extension portion over the substrate, wherein the extension portion has a bent shape, a circular shape or a C shape, an entirety of the extension portion is located at a position higher than that of the electronic element, and a receiving space is formed between the extension portion and the substrate; and
an encapsulant formed on the substrate, the encapsulant encapsulating the electronic element and the extension portion and the support portions of the antenna structure and filling the receiving space;
wherein the substrate has a circuit electrically connected to the electronic element; and
wherein the extension portion surrounds the electronic element.

2. The package of claim 1, wherein the electronic element is an active element or a passive element.

3. The package of claim 1, wherein the extension portion serves as a main body of the antenna structure.

4. The package of claim 1, wherein the support portions serve as input and ground terminals for electrically connecting the extension portion to the substrate.

5. A fabrication method of an electronic package, comprising the steps of:
- providing a substrate having a surface and at least an electronic element disposed on the surface of the substrate;
- disposing an antenna structure made of a metal frame on the surface of the substrate, wherein the antenna structure has an extension portion and a plurality of support portions connected to the extension portion for supporting the extension portion over the substrate, wherein the extension portion has a bent shape, a circular shape or a C shape, an entirety of the extension portion is located at a position higher than that of the electronic element, and a receiving space is formed between the extension portion and the substrate; and
- forming an encapsulant on the substrate with the encapsulant encapsulating the electronic element and the extension portion and the support portions of the antenna structure and filling the receiving space;
- wherein the substrate has a circuit electrically connected to the electronic element; and
- wherein the extension portion surrounds the electronic element.

6. The method of claim 5, wherein the electronic element is an active element or a passive element.

7. The method of claim 5, wherein the extension portion serves as a main body of the antenna structure.

8. The method of claim 5, wherein the support portions serve as input and ground terminals for electrically connecting the extension portion to the substrate.

* * * * *